United States Patent [19]

Kurusu et al.

[11] Patent Number: 5,327,004
[45] Date of Patent: Jul. 5, 1994

[54] SOLID-STATE IMAGING DEVICE WITH AN ELECTRICALLY CONNECTED LIGHT SHIELD LAYER

[75] Inventors: Toshirou Kurusu; Hiromi Suzuki, both of Kagoshima, Japan

[73] Assignee: Sony Corporation, Tokyo, Japan

[21] Appl. No.: 34,784

[22] Filed: Mar. 19, 1993

[30] Foreign Application Priority Data

Mar. 24, 1992 [JP]   Japan ................................ 4-098803

[51] Int. Cl.⁵ ...................... H01L 27/14; H01L 31/00
[52] U.S. Cl. .................................. 257/435; 257/233; 257/294
[58] Field of Search ............... 257/290, 291, 292, 294, 257/233, 431, 435, 59

[56] References Cited

U.S. PATENT DOCUMENTS

| | | | |
|---|---|---|---|
| 4,977,584 | 12/1990 | Kohno et al. | 257/233 |
| 5,181,093 | 1/1993 | Kawaura | 257/233 |
| 5,196,719 | 3/1993 | Miwada | 257/233 |

FOREIGN PATENT DOCUMENTS

| | | | |
|---|---|---|---|
| 0410465 | 1/1991 | European Pat. Off. | 257/294 |
| 62-51256 | 3/1987 | Japan | 257/435 |
| 3-171770 | 7/1991 | Japan | 257/435 |

*Primary Examiner*—Rolf Hille
*Assistant Examiner*—Minh Loan Tran
*Attorney, Agent, or Firm*—Hill, Steadman & Simpson

[57] ABSTRACT

A solid-state imaging device. A hole accumulation layer is provided on the surface of a photosensor region. Voltage lower than the voltage of the hole accumulation layer is applied to a light-shielding film, so that positive charges existing in a thin insulation film can be attracted toward the light-shielding film. Consequently it becomes possible to reduce a dark current.

18 Claims, 6 Drawing Sheets

SOLID-STATE IMAGING DEVICE WITH AN ELECTRICALLY CONNECTED LIGHT SHIELD LAYER

FIELD OF THE INVENTION

The present invention relates to a solid-state imaging device and method of operation. In particular, it relates to an imaging device having a hole accumulation layer on the surface of each photosensor region in a semiconductor substrate.

BACKGROUND OF THE INVENTION

Figure 7:
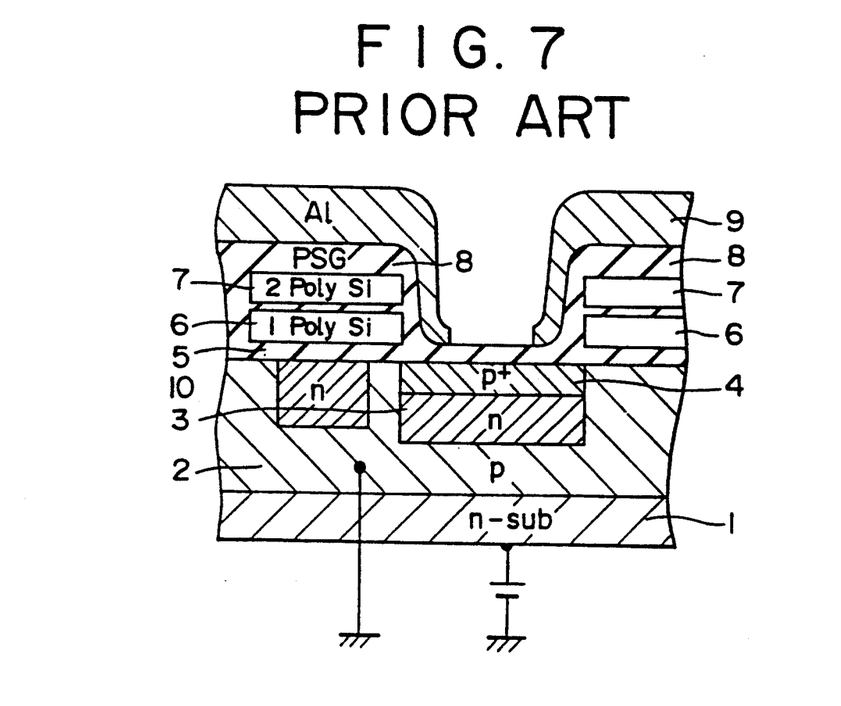
FIG. 7 is a sectional view of a conventional solid-state imaging device.
Figure 8:
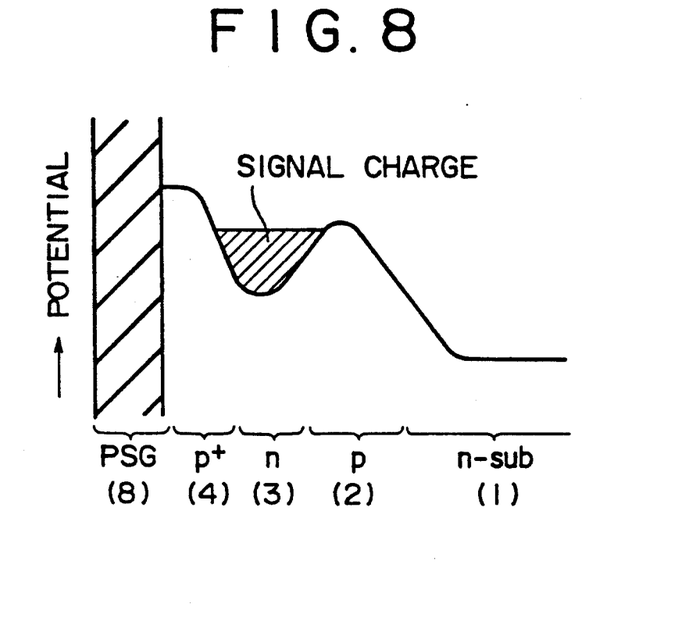
FIG. 8 graphically shows the potential profile of the conventional solid state imaging device of FIG. 7.

A solid-state imaging device is generally so constituted as shown in FIG. 7 and has a potential profile as shown in FIG. 8.

As shown in FIG. 7, a solid-state imaging device is formed upon an n-type silicon substrate 1. A p-type well 2 is formed on the surface of the substrate 1. This p-type well is grounded. A photosensor region is formed of an n-type diffusion region in the p-type well 2. A p+-type hole accumulation layer 4 is formed on the surface of each photosensor region 3. An gate insulation film 5 is formed on the surface of the substrate 1. A first polysilicon transfer electrodes 6 are provided on the film 5. A second polysilicon transfer electrodes 7 are provided above the transfer electrodes 6. An insulation film 8 covers the surface of transfer electrodes 6 & 7, the surface of the photosensor region 3 and the periphery thereof. The insulation film 8 is termed PSG film since it is usually composed of PSG (Phospho-Silicate Glass), however, other materials such as BPSG (Boro-Phospho Silicate Glass) may also be suitable. An aluminum light shielding film 9 is formed on top of the insulation film 8. A channel region 10 of a vertical register is formed in the p-type well 2 below the transfer electrodes 6 & 7.

Signal charge packets are generated in the photosensor region 3. These signal charge packets are read-out to the channel region 10 by applying a positive voltage to the second transfer electrode 7. Subsequently, the signal charge packets are transferred in the channel region 10 to the vertical direction by applying a square wave alternating between negative voltage and zero voltage to the first transfer electrodes 6. A similar square wave with opposite polarity is simultaneously applied to the second transfer electrodes 7.

The hole accumulation layer 4 is at ground voltage since it is electrically connected to the grounded p-type well 2. The layer 4 serves to absorb the electrons which are prone to become dark current. The dark current cause a spurious signal. The reason for providing such hole accumulate layer 4 will be described below.

In the insulation film 8, there are fixed charges and mobile charges of sodium ions. When electrons accumulate on the surface of the photosensor region by such fixed charges and mobile charges, it causes an increase of dark current. To avert such a phenomenon, a p+-type semiconductor layer where major carriers are positive holes, i.e., the hole accumulation layer 4, is formed on the surface of the photosensor region 3. This permits the electrons to recombine with the positive holes which are the major carriers.

Therefore, in a solid-state imaging device of a type having such hole accumulation layer 4, it is possible to reduce the dark current in comparison with any solid-state imaging device without such hole accumulation layer 4.

In conventional solid-state imaging devices, however, the hole accumulation layer 4 at ground voltage is prone to shift toward the positive by said fixed charges or when, for example, the voltage of the transfer electrode 6 or 7 is made positive. The hole accumulation layer 4 causes a depletion upon occurrence of the shift toward the positive. If such depletion is induced, large dark current is generated.

Figure 9:
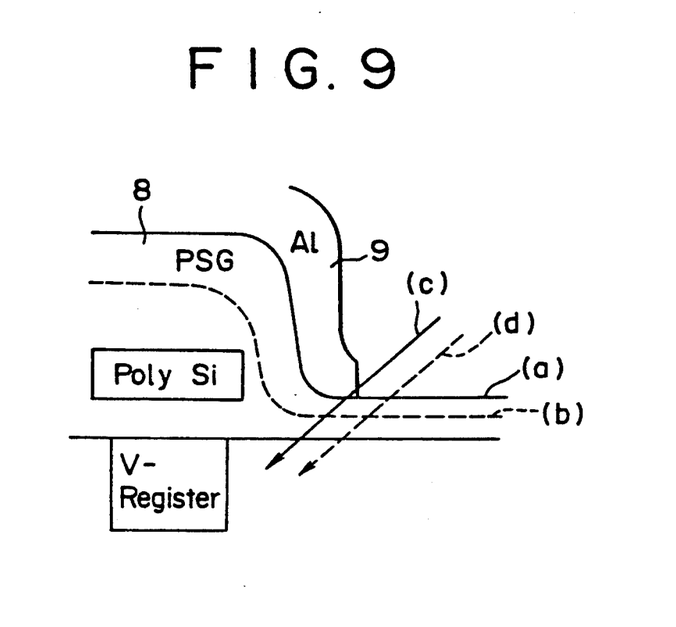
FIG. 9 graphically shows the relationship between a thickness of insulation film and smear component.

The dark current is reducible by forming the insulation film 8 thicker. This is because the field effect exerted on the photosensor region 3 by the fixed charges existing on the surface of the insulation film 8 diminishes in accordance with an increase of the thickness of the insulation film 8. Consequently, the dark current can be reduced by increasing the thickness of the insulation film 8. As shown in FIG. 9, however, if the insulation film 8 is made thicker as indicated by a solid line (a), the opening to oblique incident light is rendered wider compared with the thinner insulation film 8 as indicated by a broken line (b). Eventually, an undesired smear component is caused by direct incidence of the oblique light to the channel region 10 of the vertical register. (Oblique incident light as indicated by a solid arrow (c) comes into the channel region 10 directly along with oblique incident light as indicated by a broken arrow (d).) This phenomenon restricts the acceptable thickness of the insulation film 8. It follows therefore that it is desirable to reduce the dark current without increasing the thickness of the insulation film 8.

SUMMARY OF THE INVENTION

In view of the circumstances mentioned, it is an object of the present invention to provide an improved solid-state imaging device in which the dark current is reduced without the necessity of thickening the insulation film which covers the surface of the hole accumulation layer.

In one aspect of the present invention, a solid-state imaging device includes a semiconductor substrate, a well region which is formed on the surface of the semiconductor substrate, a photosensor region which is formed in the well region, a hole accumulation region which is formed on the surface of the photosensor region, a channel region which is adjacent to the photosensor region, a plurality of transfer electrodes which is formed on the channel region and a light-shielding film which is formed on the transfer electrodes, and a potential lower than that of the hole accumulation layer is applied to the light-shielding film.

In accordance with the present invention, positive charges existing in a thin insulation film and prone to induce a dark current can be attracted toward the light-shielding film to which voltage lower than that of the hole accumulation layer is applied, thereby diminishing the field effect exerted on the photosensor region due to such positive charges. Consequently it becomes possible to reduce the dark current that may be induced on the surface of the photosensor region by the positive charges in the thin insulation film.

BRIEF DESCRIPTION OF THE DRAWINGS

The invention will be more readily understood with reference to the accompanying drawings, wherein.

DETAILED DESCRIPTION OF THE PREFERRED EMBODIMENTS

The preferred embodiments of the present invention will be described in detail by referring to FIGS. 1 to 6. In these drawings, the same reference numerals are utilized as shown in FIG. 7 to 9 so far as the same portions are referred.

Prior to the description of the preferred embodiments of the present invention, a description will be given on the process of the technical concept developed to contrive the present invention.

As mentioned already with respect to BACKGROUND OF THE INVENTION in this specification, a dark current sharply increases upon occurrence of depletion of the hole accumulation layer 4 when, for example, positive (read-out) voltage is applied to the second transfer electrode 7.

Figure 1A:
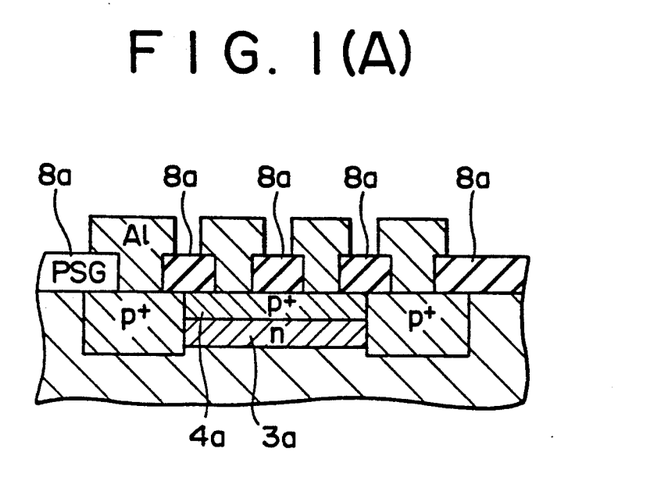
FIGS. 1(A) and 1(B) show a sensor resistance monitor, in which (A) is a sectional view thereof, and (B) is a circuit diagram for measuring the resistance.
Figure 1B:
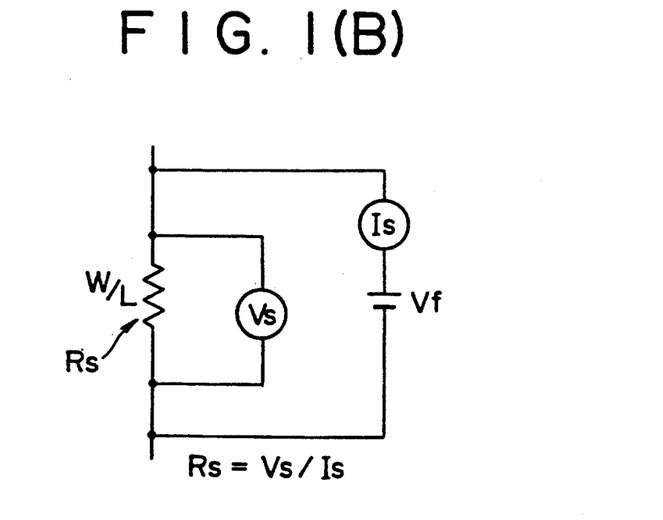

In view of such a phenomenon, the following model was devised to conform with an exemplary case of applying a positive (read-out) voltage. FIG. 1(A) is a sectional view of a sensor resistance monitor as the model, and FIG. 1(B) is a circuit diagram for measurement of such sensor resistance. The monitor was actually produced for practical experiments.

As shown in FIG. 1(A), the resistance monitor comprises an n-type photosensor region 3a equivalent to the aforementioned region 3, and a p+-type hole accumulation layer 4a having the same impunity concentration profile as that of the hole accumulation layer 4. An insulation film is denoted by 8a.

Such resistance monitor was measured by a four-probe method (Kelvin method). Specifically, the sensor current Is and the sensor voltage Vs were measured at Vf=1V, and the sensor resistance Rs was calculated by the following equation.

$$Rs = (Vs/Is) \cdot (W/L) \; [\Omega/\square]$$

where W is the width of the resistor, and L is the length thereof.

Figure 2:
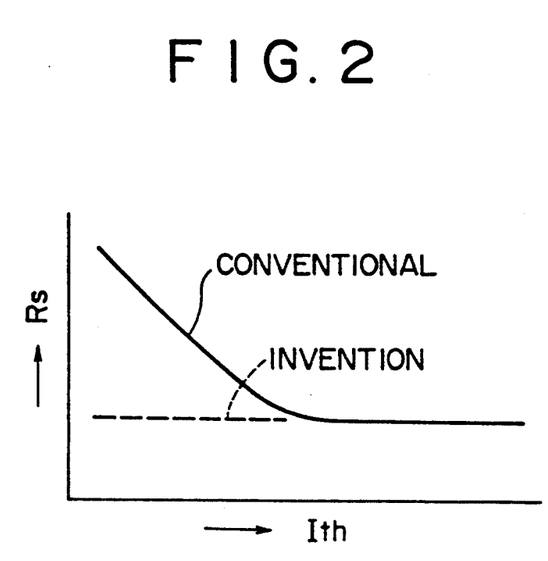
FIG. 2 graphically shows the relationship between a thickness of insulation film and a sensor resistance, in which a solid line indicates a conventional solid-state imaging device, and a broken line indicates the present invention.

FIG. 2 graphically shows the changes caused in the sensor resistance Rs due to changes in the thickness of the insulation film (Ith) 8a.

As indicated by a solid line in FIG. 2, the resistance Rs is a fixed value when the insulation film 8a has a sufficient thickness. However, the resistance Rs increases in inverse proportion to an increase of the thickness of the insulation film 8a. This phenomenon will now be explained below.

Figure 3:
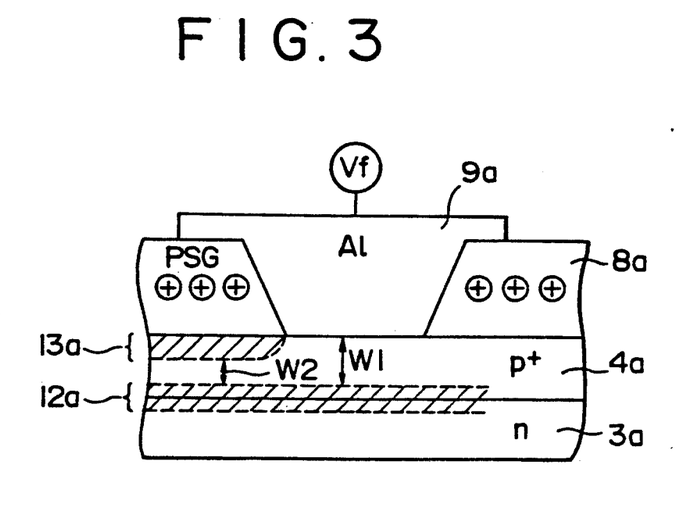
FIG. 3 is a sectional view for explaining the channel width W of the sensor resistance.

As shown in FIG. 3, the sensor resistance Rs is determined by the channel width W of the p+-type hole accumulation layer 4a. Here, W1 denotes the channel width when no fixed charges exist in the insulation film 8a. W2 denotes the channel width when fixed charges exist therein. The lower line of the channel widths are defined by an upper line of a depletion layer 12a formed in the neighborhood of the PN-junction of the photosensor region 3a and the hole accumulation layer 4a. The reason that W2 becomes smaller than W1 is concerned with extension of a depletion layer 13a in the hole accumulation layer 4a under the insulation film 8a due to the undesirable influence of the positive charges in the insulation film 8a. The sensor resistance Rs increases in accordance with a decrease of the channel width W2.

The phenomenon mentioned above occurs also in the actual solid-state imaging devices in practical use. Such depletion of the hole accumulation layer 4 causes an increase of the dark current as described. As the following describes in detail, for the purpose of averting this disadvantage, the depletion is suppressed by applying to the light-shield film 9 a negative potential which is lower than that of the hole accumulation layer 4. Then, as indicated by a broken line in FIG. 2, the sensor resistance Rs remains substantially unchanged regardless of thinning the insulation film 8. It follows, therefore, that the dark current can be reduced even if a thinner insulation film 8 is formed.

Since the insulation film 8 can thus be formed thinner, it becomes possible to reduce the undesired smear as well. The effect of minimizing the smear in accordance with thinning of the insulation film 8 can be seen by reviewing FIG. 9. A decrease of the insulation film thickness narrows the opening to the oblique light to the channel region 10 of the vertical register, i.e., the light that causes the smear.

Hereinafter the solid-state imaging device of the present invention will be described in detail with reference to preferred embodiments thereof.

Figure 4:
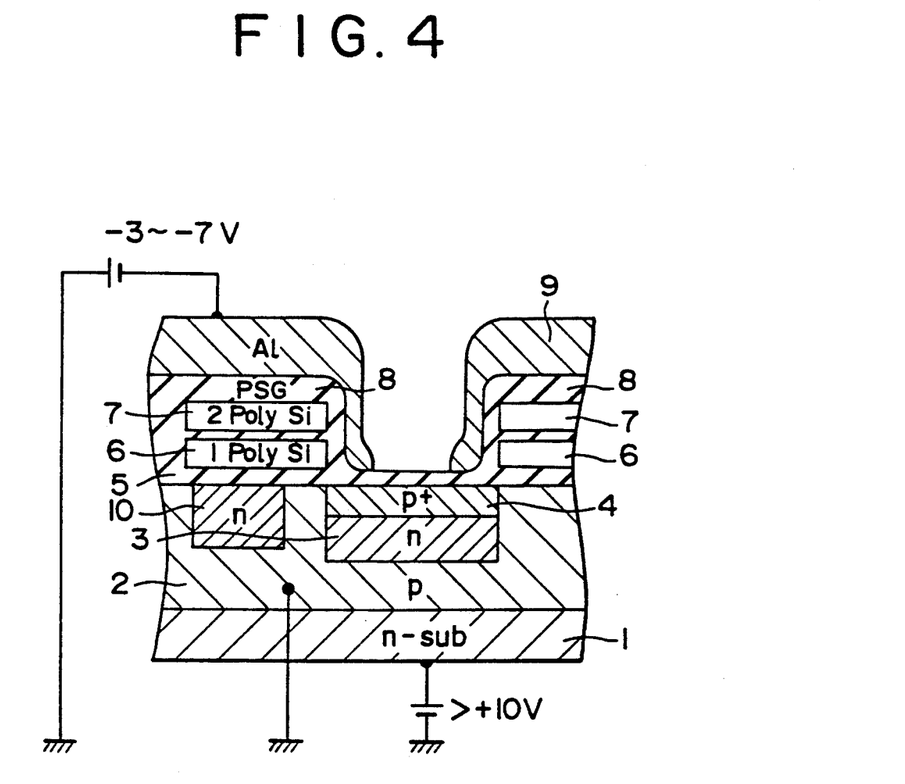
FIG. 4 is a sectional view of a first embodiment representing the solid-state imaging device of the present invention.

FIG. 4 shows a sectional view of a first embodiment representing the solid-state imaging device of the present invention.

In comparison with the aforementioned conventional solid-state imaging device of FIG. 7, this embodiment is different in that voltage lower than that of a hole accumulation layer 4 is applied to a light-shielding film 9 serving for interception of incident light. Other structures are substantially the same. Therefore a repeated explanation is omitted here with respect to such common points, and the points of difference will be described below.

In the solid-state imaging device of the first embodiment, negative voltage less than approximately −3V, preferably in a range of about −3 to −7V is applied to the light-shielding film 9 which is made, for example, of aluminum or the like. In the conventional solid-state imaging device, such light-shielding film 9 is kept in an electrically floating state. The hole accumulation layer 4 of this embodiment is at ground voltage since it is electrically connected to p-type well 2 which is grounded.

Therefore voltage difference of more than about 3V is produced between the light-shielding film 9 and the hole accumulation layer 4, whereby the light-shielding film 9 is rendered negative.

Such application of negative voltage, which is lower than the voltage of the hole accumulation layer 4, to the light-shielding film 9 is based on the following reason.

Figure 5:
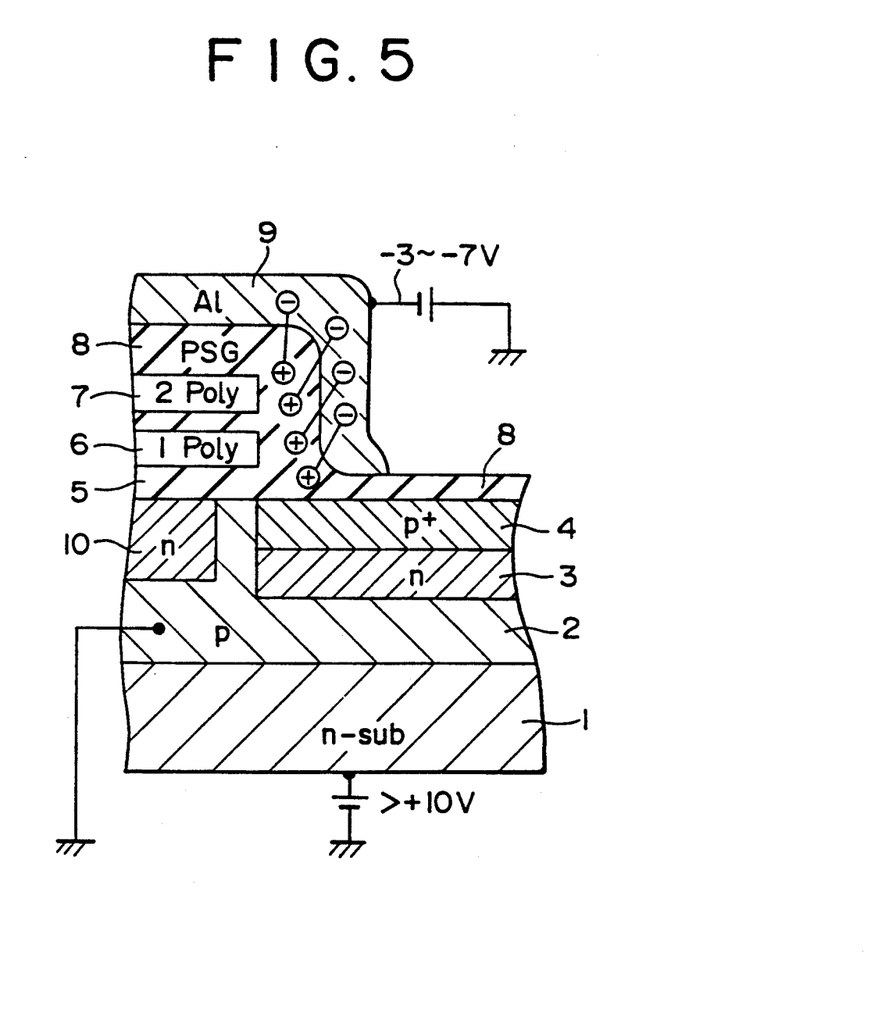
FIG. 5 is a sectional view for explaining the principle of the present invention.

As shown in FIG. 5, the positive charges existing in an insulation film 8 are attracted toward the light-shield film 9 by the negative voltage. Consequently the undesirable influence on a photosensor region due to the positive charges in the insulation film 8 can be decreased. Generation of electrons that may cause dark current can be thus minimized.

The absolute value of the negative voltage applied to the light-shielding film 9 needs to be greater than the minimum required value for canceling the field effect exerted on the surface of the photosensor region 3 due to the fixed charges in the insulation film 8. Specifically, such absolute value needs to be higher than about 3V in the present embodiment. It is desired that the negative voltage has the possible maximum value in regard to reduction of the dark current. However, an intense electric field exceeding the withstand voltage of the insulation film 8 and a gate insulation film 5 may be exerted thereon in case the absolute value is excessive. In the present embodiment, the negative voltage is preferably in the range of about 3 to 7V.

In the solid-state imaging device mentioned above, the positive charges existing in the insulation film 8 are attracted toward the light-shielding film 9 by the negative voltage applied to the light-shielding film 9. The positive charges in the insulation film 8 can therefore be decreased without the necessity of thickening the insulation film 8, hence suppressing generation of electrons that may cause the dark current.

Figure 6:
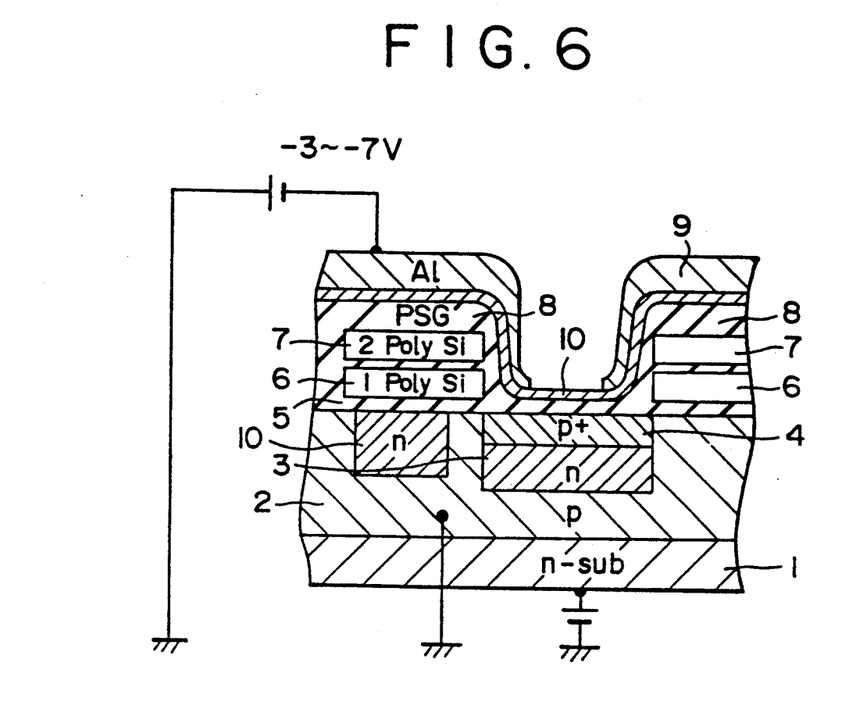
FIG. 6 is a sectional view of a second embodiment representing the solid-state imaging device of the present invention.

FIG. 6 shows a sectional view of a second embodiment representing the solid-state imaging device of the present invention.

In comparison with the foregoing solid-state imaging device of FIG. 4, this embodiment is different in that a thin polysilicon film 11 is formed on a insulation film 8, and a light-shielding film 9 is formed on such polysilicon film 11. Other structures are the same. The thin polysilicon film 11 is formed for the purpose of extending the field effect, which is exerted to prevent the depletion that may cause a sharp increase of the dark current, over the entire region of a photosensor region 3.

In the solid-state imaging device of FIG. 4, the field effect for preventing the depletion is hardly extendable to the center portion of the photosensor region 3 though being exertable over the peripheral portion thereof. However, in the solid-state imaging device of FIG. 6, where the polysilicon film 11 covers the entire surface of the photosensor region 3, voltage which is negative to the hole accumulation layer 4 is applied to such polysilicon film 11. This voltage is higher in absolute value than about 3V, and is preferably in a range of about 3 to 7V. Consequently the field effect for preventing a depletion can exert over the entirety of the photosensor region 3, attaining the desired result of further reducing the dark current.

If the polysilicon film 11 is too thick, it deteriorates the sensitivity of the photosensor region 3, particularly the sensitivity to incident light of short wavelengths. It is therefore preferred that the thickness be less than 1500 angstroms.

The transfer electrodes 6 and 7 are supplied with transfer pulses changed between about −9V and 0V. At the time of reading-out a signal, positive voltage of about 15V is applied thereto momentarily. Normally such high voltage may cause some variation in the potential of the hole accumulation layer 4. However, in each of the solid-state imaging devices of FIGS. 4 and 6 where negative voltage is applied to the light-shielding film 9 of aluminum and also to the polysilicon film 11, the disadvantageous field effect derived from the positive voltage of 15V or so can be alleviated.

While specific embodiments of the invention have been shown and disclosed, it is to be understood that numerous changes and modifications may be made by those skilled in the art without departing from the scope and intent of the invention.

What is claimed is:

1. A solid-state imaging device comprising:
   a photosensor region having a surface,
   a hole accumulation layer on said surface of said photosensor region,
   an insulation film covering said hole accumulation layer,
   a light-shielding film partially covering said insulation film, and
   means for applying voltage to said light-shielding film, said voltage being lower than a voltage at said hole accumulation layer, such that positive charges in said insulation film are attracted toward said light-shielding film.

2. A solid-state imaging device according to claim 1, wherein said hole accumulation layer is at ground voltage.

3. A solid-state imaging device according to claim 1, wherein the voltage applied to said light-shielding film is less than −3 volts.

4. A solid-state imaging device according to claim 3, wherein the voltage to said light-shielding film is in a range of −3 volts to −7 volts.

5. A solid-state imaging device comprising:
   a semiconductor substrate of one conductivity type,
   a well region of another conductivity type formed on a surface of said semiconductor substrate,
   a photosensor region of said one conductivity type formed in said well region,
   a hole accumulation region of said another conductivity type formed on a surface of said photosensor region,
   a channel region adjacent to said photosensor region,
   a plurality of transfer electrodes formed on said channel region,
   an insulation film formed on said hold accumulation region, on said transfer electrodes and periphery of said transfer electrodes,
   a light-shielding film formed on said transfer electrodes via said insulation film, and
   means for applying voltage to said light-shielding film, said voltage being lower than a voltage at said hole accumulation layer, such that positive charges in said insulation film are attracted toward said light-shielding film.

6. A solid-state imaging device according to claim 5, wherein said hole accumulation layer is at ground voltage.

7. A solid-state imaging device according to claim 5, wherein the voltage applied to said light-shielding film is less than −3 volts.

8. A solid-state imaging device according to claim 7, wherein the voltage applied to said light-shielding film is in a range of −3 volts to −7 volts.

9. A solid-state imaging device comprising:
   a semiconductor substrate of one conductivity type, a well region of another conductivity type formed on a surface of said semiconductor substrate, a photosensor region of said one conductivity type formed in said well region, a hole accumulation region of said another conductivity type formed on a surface of said photosensor region, a channel region adjacent to said photosensor region, a plurality of transfer electrodes formed on said channel region, an insulation film formed on said hole accumulation region, on said transfer electrodes and periphery of said transfer electrodes, a light-shielding film formed on said insulation film, a polysilicon film formed at least on said hole accumulation layer and electrically connected to said light-shielding film, and means for applying voltage to said light-shielding film, said voltage being lower than a voltage at said hole accumulation layer.

10. A solid-state imaging device according to claim 9, wherein said hole accumulation layer is at ground voltage.

11. A solid-state imaging device according to claim 9, wherein the voltage applied to said light-shielding film is less than $-3$ volts.

12. A solid-state imaging device according to claim 11, wherein the voltage applied to said light-shielding film is in a range of $-3$ volts to $-7$ volts.

13. A solid-state imaging device according to claim 9, wherein a thickness of said polysilicon film is less than 1500 angstroms.

14. A solid-state imaging device comprising:

an n-type semiconductor substrate, a p-type well region formed on the surface of said n-type substrate, an n-type diffusion region formed in said p-type well and defining a photosensor region, a p+-type hole accumulation layer formed on a surface of said n-type diffusion region, an n-type channel region adjacent to said photosensor region, a first plurality of transfer electrodes formed on said channel region, a second plurality of transfer electrodes formed on said channel region, an insulation film formed on said hole accumulation layer, on said transfer electrodes and said periphery of said transfer electrodes, a polysilicon film having thickness less than about 1500 angstroms formed on said hole accumulation layer, a conductive light-shielding film formed on said insulation film and electrically connected to said polysilicon film, and means for applying voltage to said light-shielding film of between $-3$ and $-7$ volts lower than a voltage applied to said hole accumulation layer.

15. A method of operating a solid-state imaging device including a semiconductor substrate, a well region formed on a surface of said semiconductor substrate, a photosensor region formed in said well region, a hole accumulation region formed on a surface of said photosensor region, a channel region adjacent to said photosensor region, a plurality of transfer electrodes on said transfer electrodes, comprising the steps of, applying a voltage lower than that of said hold accumulation layer to said light-shielding film, such that positive charges in said insulation film are attracted toward said light-shielding film, and applying a positive voltage to one of said transfer electrodes.

16. A method of operating a solid-state imaging device according to claim 15, wherein said hole accumulation layer is at ground potential.

17. A method of operating a solid-state imaging device according to claim 15, wherein the voltage applied to said light-shielding film is less than $-3$ volts.

18. A method of operating a solid-state imaging device according to claim 15, wherein the voltage applied to said light-shielding film is in a range of $-3$ volts to $-7$ volts.

* * * * *